(12) United States Patent
Diez

(10) Patent No.: US 11,824,289 B2
(45) Date of Patent: *Nov. 21, 2023

(54) CONNECTABLE ELECTRIC DEVICE TO A TEXTILE ELECTRICALLY CONDUCTIVE BAND

(71) Applicant: VIBIA LIGHTING S.L., Gavà (ES)

(72) Inventor: Stefan Diez, Gavà (ES)

(73) Assignee: VIBIA LIGHTING S.L., Gava (ES)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,779

(22) Filed: Apr. 24, 2023

(65) Prior Publication Data

US 2023/0261396 A1 Aug. 17, 2023

Related U.S. Application Data

(63) Continuation of application No. 17/601,996, filed as application No. PCT/EP2020/055300 on Feb. 28, 2020, now Pat. No. 11,670,880.

(30) Foreign Application Priority Data

Apr. 8, 2019 (EP) .................................... 19382260

(51) Int. Cl.
*H01R 12/65* (2011.01)
*H01R 13/627* (2006.01)
(Continued)

(52) U.S. Cl.
CPC .......... *H01R 12/65* (2013.01); *H01R 13/629* (2013.01); *H01R 13/6272* (2013.01); *H05K 1/038* (2013.01); *H05K 1/147* (2013.01)

(58) Field of Classification Search
CPC .. H01R 4/2404; H01R 12/65; H01R 13/6272; H01R 13/629; H05K 1/038; H05K 1/047
(Continued)

(56) References Cited

U.S. PATENT DOCUMENTS 4,728,300 A 3/1988 Shillito et al.
4,927,366 A 5/1990 Tommerson et al.
(Continued)

FOREIGN PATENT DOCUMENTS

| FR | 2740269 A1 | 4/1997 |
| FR | 2835973 A1 | 8/2003 |
| WO | 2010026511 A1 | 3/2010 |

OTHER PUBLICATIONS

International Search Report from corresponding International Application No. PCT/EP2020/055300 dated May 4, 2020.
(Continued)

*Primary Examiner* — Gary F Paumen
(74) *Attorney, Agent, or Firm* — TUCKER ELLIS LLP

(57) ABSTRACT

Electric device with electric connection means suitable for connecting it to an electric power source, comprising a supporting surface for a textile electrically conductive band and retention means for retaining the textile electrically conductive band on supporting surface. Electric connection means comprise piercing means for piercing the textile electrically conductive band which are suitable for conducting an electric current. Textile electrically conductive band is made of double weaving and comprises two mutually parallel electrically conductive guides extending along the band. Each of the electrically conductive guides is located between two layers of textile material of said double weaving.

16 Claims, 19 Drawing Sheets

(51) Int. Cl.
*H01R 13/629* (2006.01)
*H05K 1/03* (2006.01)
*H05K 1/14* (2006.01)

(58) Field of Classification Search
USPC .................................................. 439/37, 426
See application file for complete search history.

(56) References Cited

U.S. PATENT DOCUMENTS

| | | |
|---|---|---|
| 6,319,015 B1 | 11/2001 | Faunce |
| 8,460,006 B2 | 6/2013 | Debock et al. |
| 11,020,285 B1 | 6/2021 | King et al. |
| 11,670,880 B2 * | 6/2023 | Diez .................... H05K 1/147 |
| | | 439/67 |
| 2019/0289927 A1 | 9/2019 | Athauda et al. |

OTHER PUBLICATIONS

International Preliminary Report on Patentability from corresponding International Application No. PCT/EP2020/055300 dated Jun. 18, 2021.

* cited by examiner

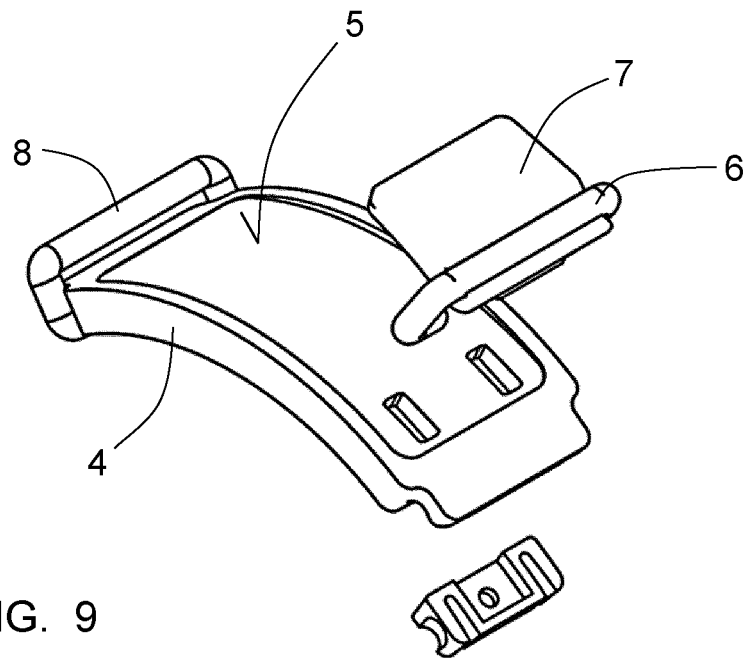
FIG. 9
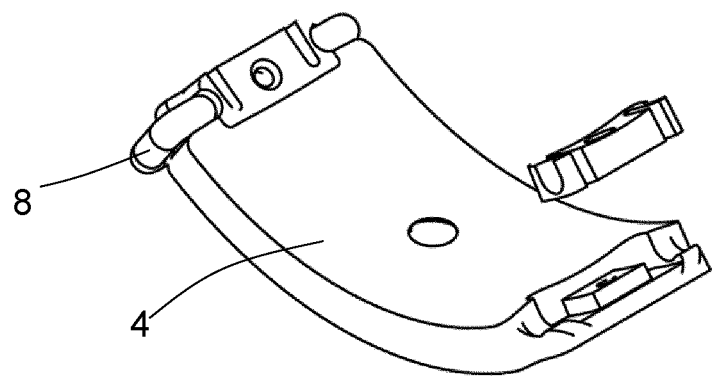
FIG. 10
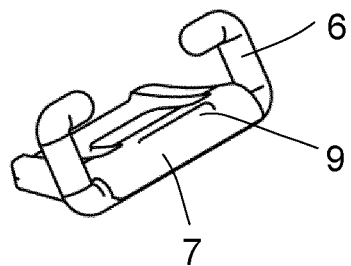

CONNECTABLE ELECTRIC DEVICE TO A TEXTILE ELECTRICALLY CONDUCTIVE BAND

RELATED APPLICATION DATA

This application is a continuation application, which claims priority to United States application number U.S. Ser. No. 17/601,996 filed Oct. 7, 2021, which is a national phase application of International Application No. PCT/EP2020/055300 filed Feb. 28, 2020, which claims priority to European Application No. EP 19382260.8 filed Apr. 8, 2019. The entireties of the aforementioned applications are incorporated herein by reference.

FIELD OF THE INVENTION

The invention refers to an electric device with electric connection means suitable for connecting the electric device to an electric power source. The invention further refers to an electric system comprising an electric device according to the invention and a textile electrically conductive band according to the invention.

BACKGROUND

Electrically conductive textile bands are known. However, these textile bands which, for example, serve the purpose of transmitting data or preventing the accumulation of electrostatic electricity, have a number of drawbacks. For example:
- the conductive threads are at sight,
- they only withstand low voltages and/or intensities of electric current,
- they have poor mechanical properties,
- etc.

Nevertheless, there is the need of solving these drawbacks and marketing a system allowing the fast, simple, versatile connection of electric devices to an electric power source, including cases in which it is necessary a relatively high electric power supply (such as, for example, in the case of lighting units), and ensuring a suitable electric insulation.

FR2835973A1 discloses a connecting device for a textile electrically conductive band provided with jacketed wires. The device comprises a first metallic part which forms a holder delimitated by walls with sharped edges, and a second part which engages in said holder for trapping the textile electrically conductive band. The engagement of the second part in the first part causes the jacketed wires to be stripped at the sharped edges of the holder, so that an electric contact is established between the wires and the first part.

DISCLOSURE OF THE INVENTION

The object of the invention is overcoming these drawbacks. This object is achieved by means of an electric device of the above-indicated type, wherein said electric device comprises a supporting surface for a textile electrically conductive band and retention means for retaining the textile electrically conductive band on the supporting surface, said electric connection means comprising piercing means for piercing the textile electrically conductive band, wherein the piercing means are suitable for conducting an electric current, characterized in that the piercing means comprise two sets of needles emerging from the supporting surface.

The electric device according to the invention allows incorporating one or several optional alternatives and improvements:

Preferably, each set of needles comprises between 4 and 12 needles, and more preferably, between 6 and 10 needles. Advantageously, the needles of each set of needles are distributed in between 1 and 3 rows, preferably in 2 rows. Furthermore, it is advantageous that the needles project between 1.5 and 3.5 mm with respect to the supporting surface, and preferably project between 2.2 and 2.8 mm with respect to the supporting surface. These options provide a fast simple way of connecting the electric element to the textile electrically conductive band, and ensure a good electric contact, both for its distribution and amount of needles, and for being able to traverse the non-conductive portion of the textile electrically conductive band, but without totally traversing said textile electrically conductive band.

The retention means comprise an arch arranged on the supporting surface, where the arch comprises a lever suitable for rotating around the arch between a release position and a retention position, the lever comprising a cam suitable for tightening the textile electrically conductive band on the supporting surface when it is in the retention position. This mechanism allows mechanically fixing the electric element in the textile electrically conductive band, while it allows establishing the electric connection. It does not require any tools and it is extremely simple to carry out, without needing to have any skilled staff to do it.

The piercing means are adjacent to the lever. In this way, it is taken the most advantage of the compression force exerted by the lever on the textile electrically conductive band, and it is ensured that the piercing means suitably pierce the textile electrically conductive band. Preferably, when the lever is in the retention position, it rests on the band covering the piercing means, given that, in this way, the same lever serves as a protection element and prevents anyone from touching the textile electrically conductive band above the piercing means. Preferably, the arch is formed by a C-shaped part with the ends of the C connected to the electric device below the supporting surface, and preferably the retention means comprise a second arch arranged on the supporting surface, wherein the arch and the second arch define a passage for the textile electrically conductive band. As will be detailed in the Figures, these preferred embodiments allow a very quick simple assembly and disassembly of the electric device, without the need of any tools.

The electric device may be any, but preferably it is a lighting unit with at least a light source which is electrically connected to the electric connection means or it is an electric sensor.

A further object of the invention is an electric system comprising an electric device according to the invention and the textile electrically conductive band. The textile electrically conductive band may incorporate the following one or more optional alternatives and improvements:

The textile electrically conductive band is made of double weaving and comprises two mutually parallel electrically conductive guides extending along said band, wherein each of said electrically conductive guides is located between two layers of textile material of said double weaving.

Each of the electrically conductive guides may be formed by a plurality of metal threads, preferably of copper, where the metal threads do not have any insulating covering. It is particularly interesting that the electrically conductive threads do not have any insulating covering, so that, upon contacting the piercing means, an electric contact is immediately established. In this way, the piercing means must simply pierce the fabric of the textile electrically conductive band wrapping the metal threads, but they must not pierce any type of covering insulating each metal thread in an individual fashion.

Each of the electrically conductive guides has a width comprised between 0.3 and 1.5 cm, preferably between 0.5 and 0.7 cm.

Each guide is formed by 2 to 20 metal threads, preferably 6 to 10 metal threads. A smaller amount of threads does not ensure a good electric connection, while a higher amount of threads is unnecessary.

Between the two electrically conductive guides, there is a separation comprised between 0.3 and 1.8 cm, preferably between 0.7 and 1.1 cm. The minimum separation is enough to guarantee that a short-circuit cannot occur due to the fact that the metal threads of one guide electrically contact the metal threads of the other guide. Higher separations to those indicated unnecessarily enlarge the width of the textile electrically conductive band.

The metal threads are copper threads and have a cross-section comprised between 0.10 and 0.35 mm$^2$. These sections allow ensuring an enough electric power supply (for example, for using LED lighting units) and, however, have enough flexibility for the textile electrically conductive band not to be excessively "stiffened".

The textile electrically conductive band is formed with threads of polymer material, preferably of polyester. Preferably, the threads of polymer material have 50 to 500 tex.

The textile electrically conductive band has a weft with 10 to 50 threads/cm and/or a warp with 10 to 60 threads/cm.

These alternatives (either alone or in combination) allow obtaining a textile electrically conductive band combining the properties and features of textile band in general (mechanical properties, appearance, texture, flexibility, possible decoration, etc.) but, further, they allow a suitable insulation of the metal threads without making it difficult for the piercing means to access the metal threads and establishing a good electric connection.

Preferably, the textile electrically conductive band has a total width comprised between 2 and 4 cm, preferably between 2.4 and 2.6 cm.

As indicated before, preferably the textile electrically conductive band is totally made of double weaving, thereby providing it with a better appearance. Nevertheless, it is advantageous that the two layers of double weaving are interlaced to one another by 4 to 21 warp threads per cm.

A further object of the invention is a textile electrically conductive band as previously described.

BRIEF DESCRIPTION OF THE DRAWINGS

Other advantages and features of the invention are apparent from the following description, in which, without being a limitation, reference is made to preferred embodiments of the invention, mentioning the attached drawings. The figures show:

FIG. 9, an upper perspective view of an exploded sub-assembly, of the system of FIG. 1.

FIG. 10, a bottom perspective view of the sub-assembly of FIG. 9.

FIGS. 31 to 36, 6 weaving drafts of different embodiments of a textile electrically conductive band according to the invention.

DETAILED DESCRIPTION OF EMBODIMENTS OF THE INVENTION

Figure 1:
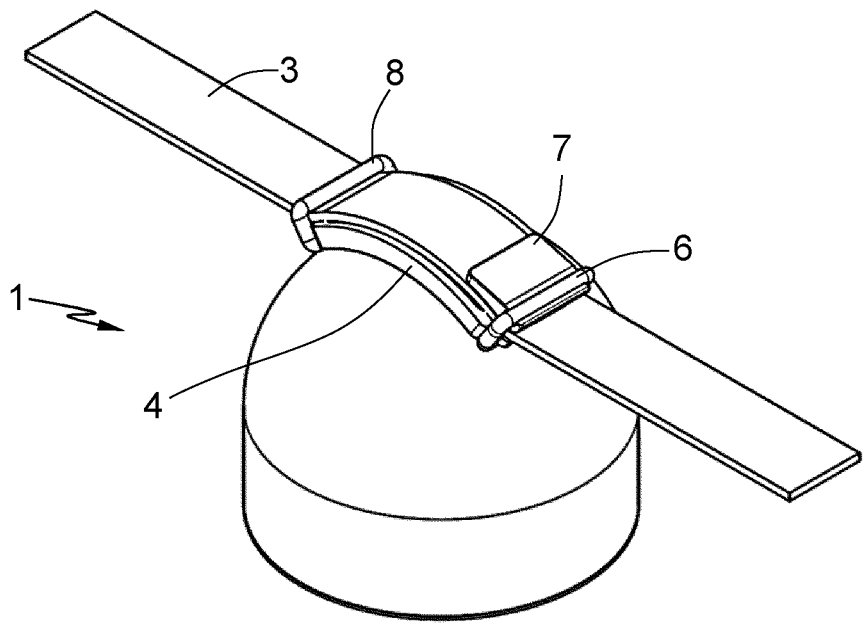
FIG. 1, a perspective view of a first embodiment of a system according to the invention.
Figure 2:
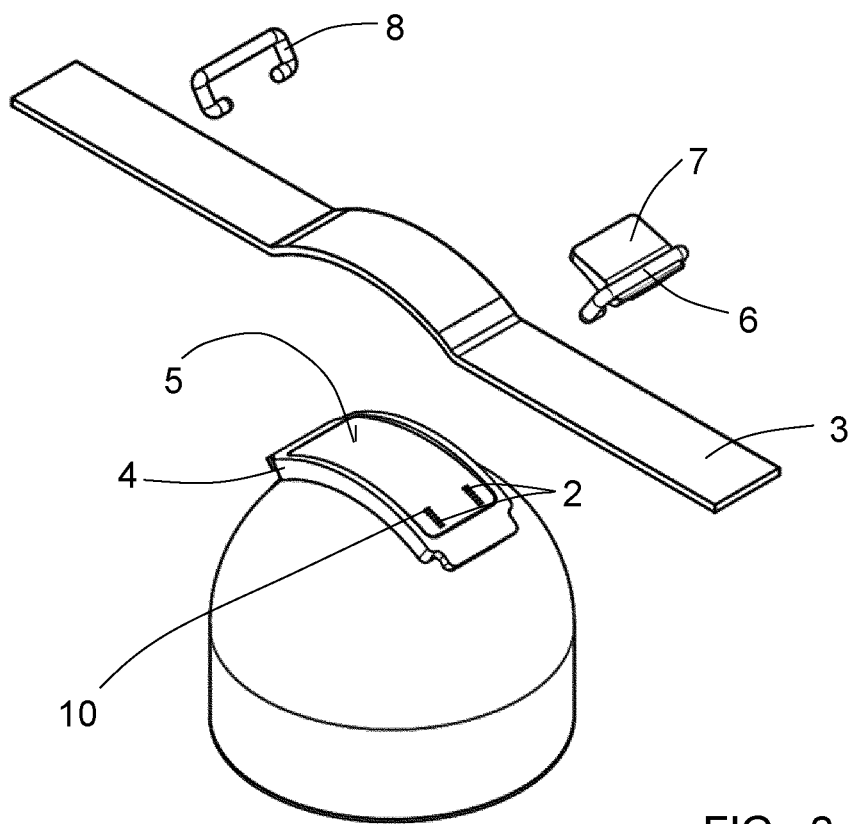
FIG. 2, a perspective view of the system of FIG. 1 before being assembled.
Figure 3:
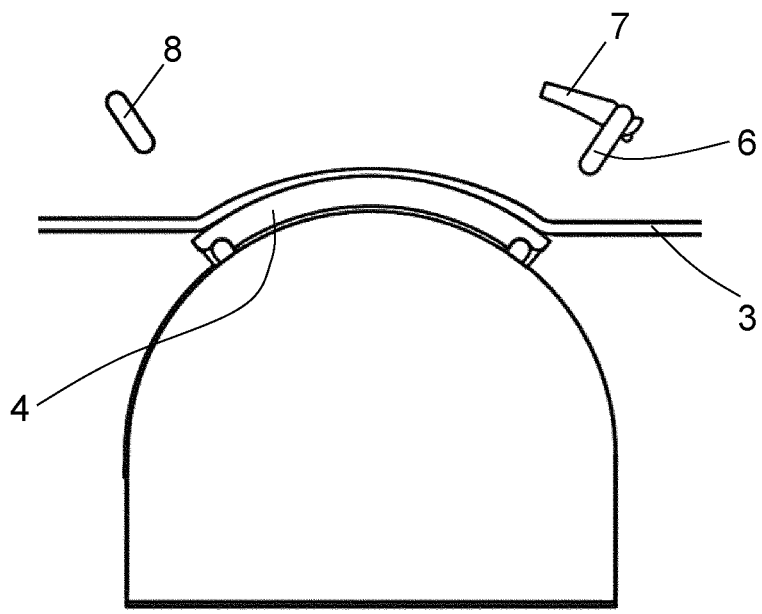
FIG. 3, a side elevation view of the system according to FIG. 1 with the arches being separated.
Figure 4:
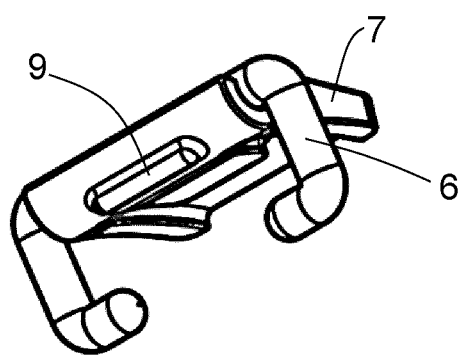
FIGS. 4 and 5, a perspective and side elevation view, respectively, of the assembly formed by a lever with its corresponding arch.
Figure 5:
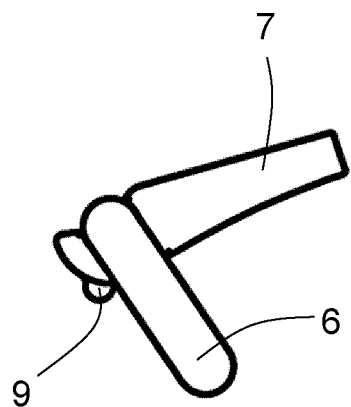
Figure 6:
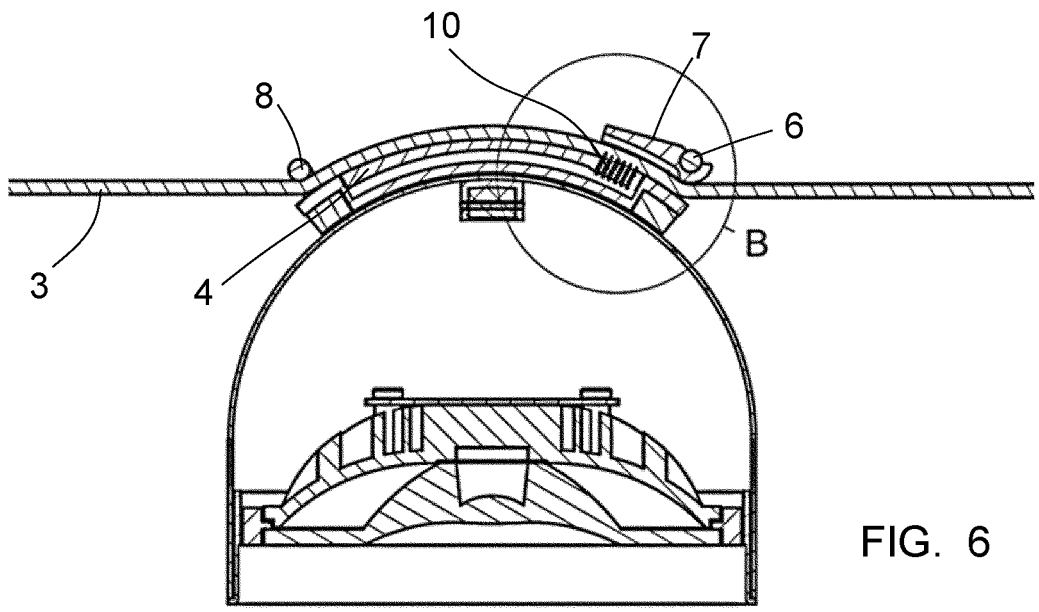
FIG. 6, a longitudinal cut of the system of FIG. 1 according to a plane comprising one of the piercing means.
Figure 7:
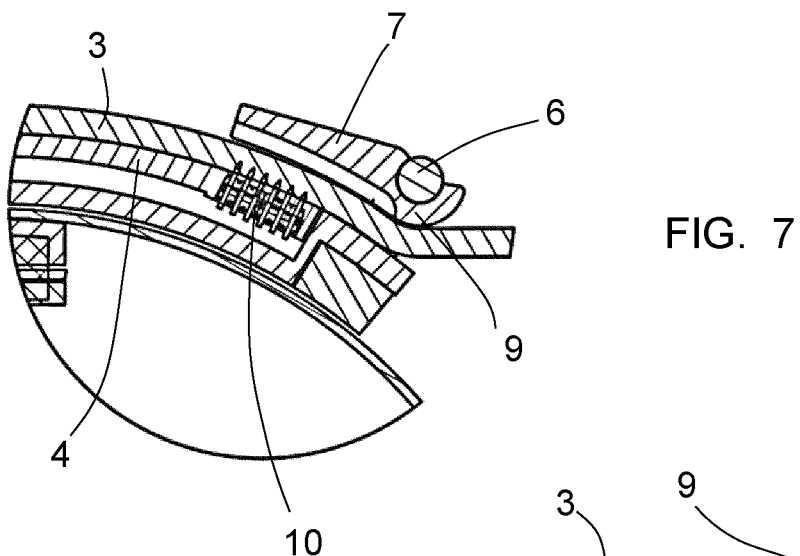
FIG. 7, an enlarged view of region "B" of FIG. 6.
Figure 8:
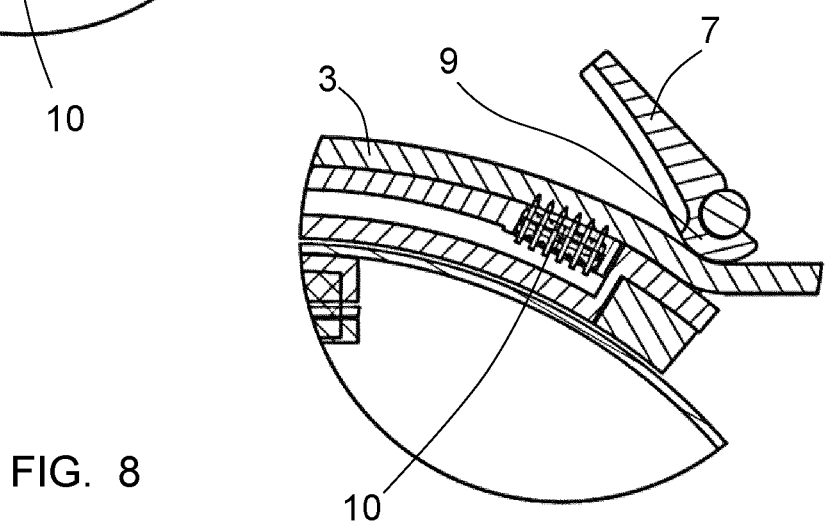
FIG. 8, an equivalent view to FIG. 7 but with the lever in a half-open position.
Figure 11:
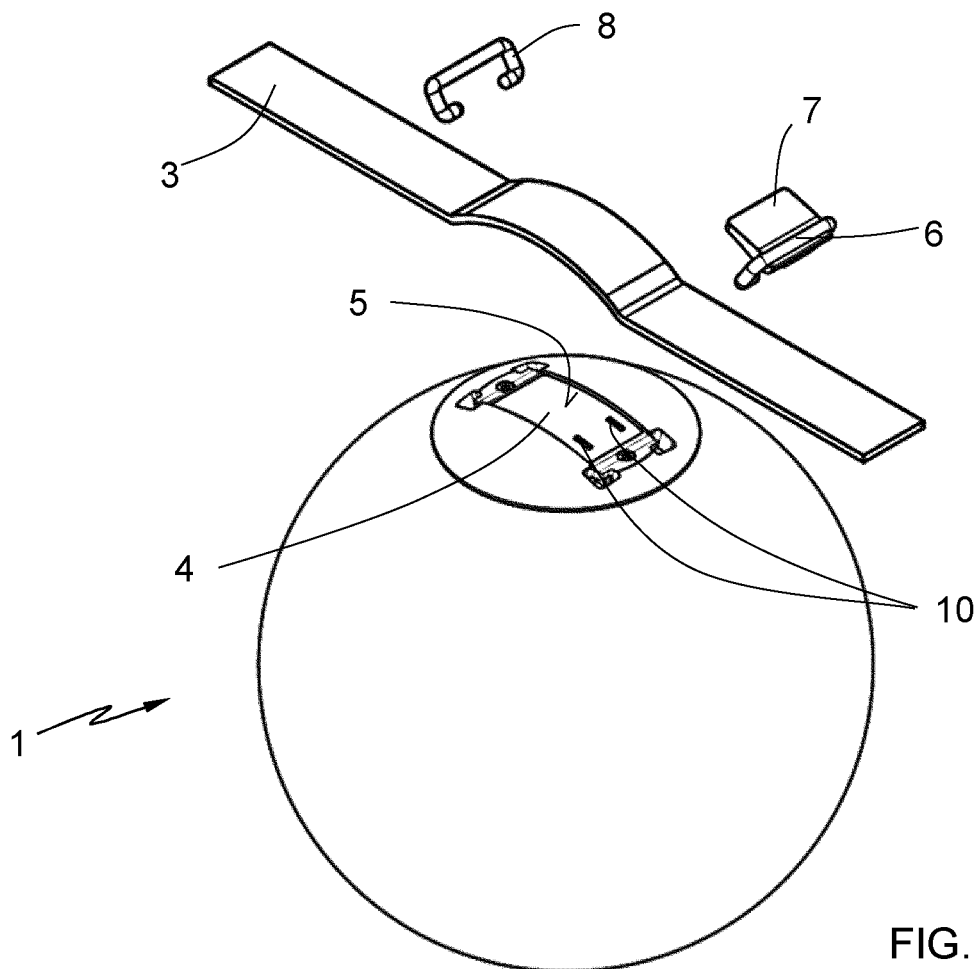
FIG. 11, a perspective view of a second embodiment of a system according to the invention.
Figure 12:
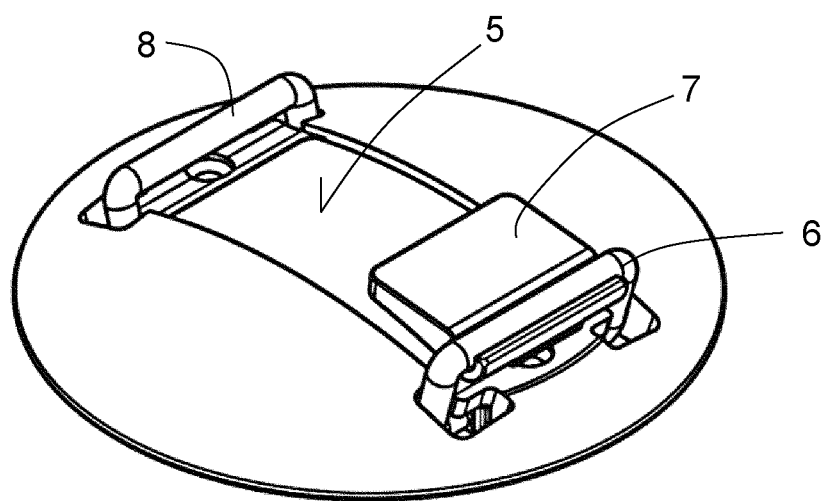
FIG. 12, a perspective view of the connection means of the system of FIG. 11.
Figure 13:
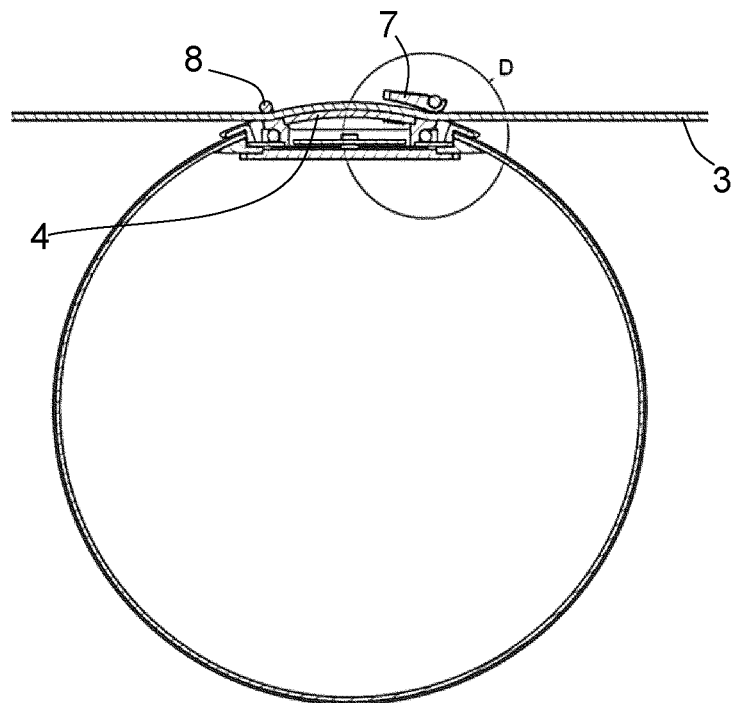
FIG. 13, a longitudinal cut of the system of FIG. 11 according to a plane comprising one of the piercing means.
Figure 14:
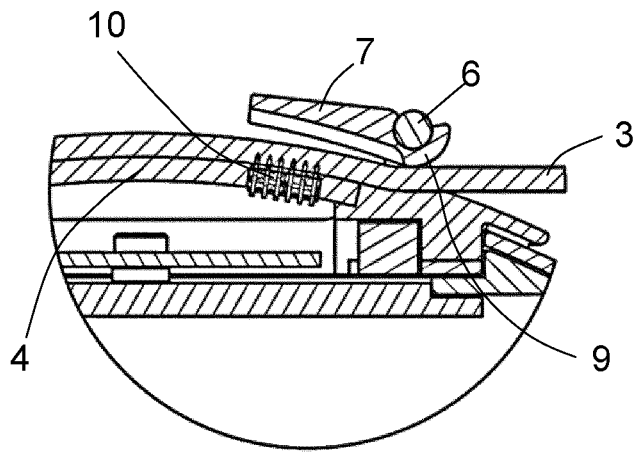
FIG. 14, an enlarged view of region "D" of FIG. 13.
Figure 15:
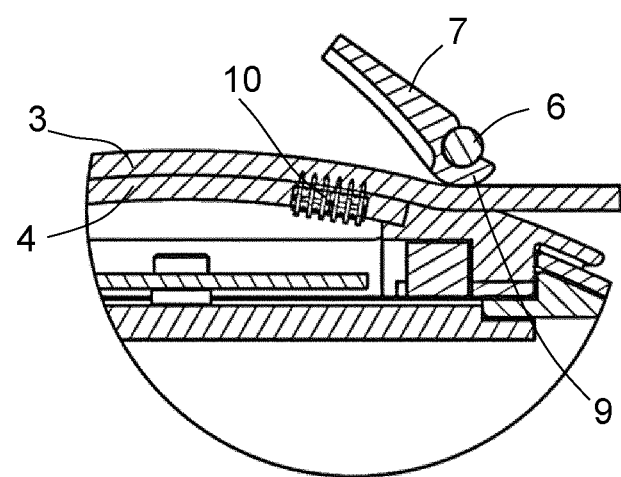
FIG. 15, an equivalent view to FIG. 14, but with the lever in a half-open position.

FIGS. 1 to 10 show a first embodiment of a system according to the invention. The system comprises an electric device 1, particularly a lighting unit 1, with electric connection means 2 for connecting the lighting unit 1 to a textile electrically conductive band 3, which is an electric power source, as will be described hereinafter. The lighting unit 1 has a support 4, which upper surface has a supporting surface 5 for the textile electrically conductive band 3. Textile electrically conductive band 3 is fixed to supporting surface 5 by retention means comprising a C-shaped arch 6 having its two ends fixed to support 4 by a snap-fitting system enabling the rotation of arch 6 through an axis passing by the two ends. The snap-fitting system is reversible. In the central portion of arch 6, a lever 7 fixed to arch 6 is mounted by a snap-fitting system enabling the rotation of lever 7 around an axis passing by the central section of the C. A second arch 8, also C-shaped but with less height, is also fixed in support 4. Arch 6 and second arch 8 are aligned to one another such that they define a passage above the supporting surface 5 through which textile electrically conductive band 3 extends.

Lever 7 has a cam 9 so that, upon rotating lever 7, cam 9 contacts textile electrically conductive band 3 and presses it against supporting surface 5.

Supporting surface 5 has two holes through which two sets of needles 10 project, these sets of needles being the piercing means. In this embodiment, each set of needles 10 is formed by two mutually parallel rows, with 6 needles each. The two sets of needles 10 are close to the arch 6. In this way, the force exerted by cam 9 pushing textile electrically conductive band 3 against the supporting surface clearly affects the portion of the textile electrically conductive band 3 which is above the sets of needles 10.

When lever 7 is in the retention position (see, for example, FIG. 7), lever 7 is located above the portion of the textile electrically conductive band 3 which is on the sets of needles 10. This portion of textile electrically conductive band 3 is thereby totally protected.

Figure 16:
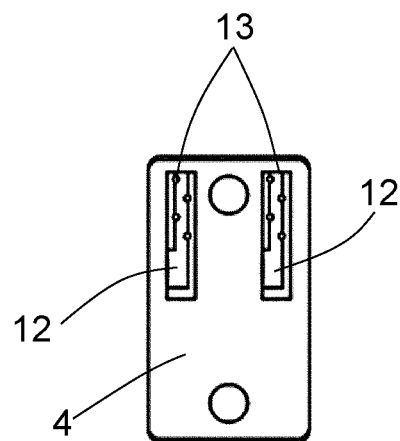
FIGS. 16, 17 and 18, a bottom plan, side and front elevation view, of a support comprising the supporting surface of the system of FIG. 11.
Figure 17:
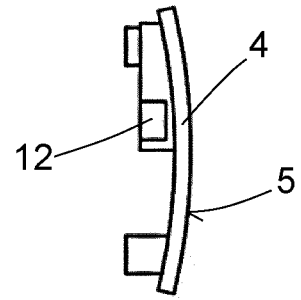
Figure 18:
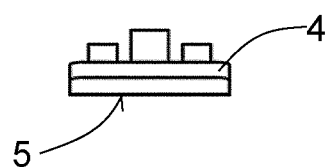
Figure 19:
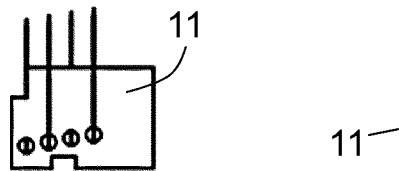
FIGS. 19, 20 and 21, a side elevation, front elevation and top plan view, respectively, of a set of needles of the system of FIG. 11.
Figure 20:
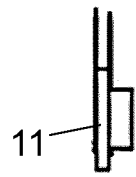
Figure 21:
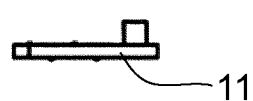
Figure 22:
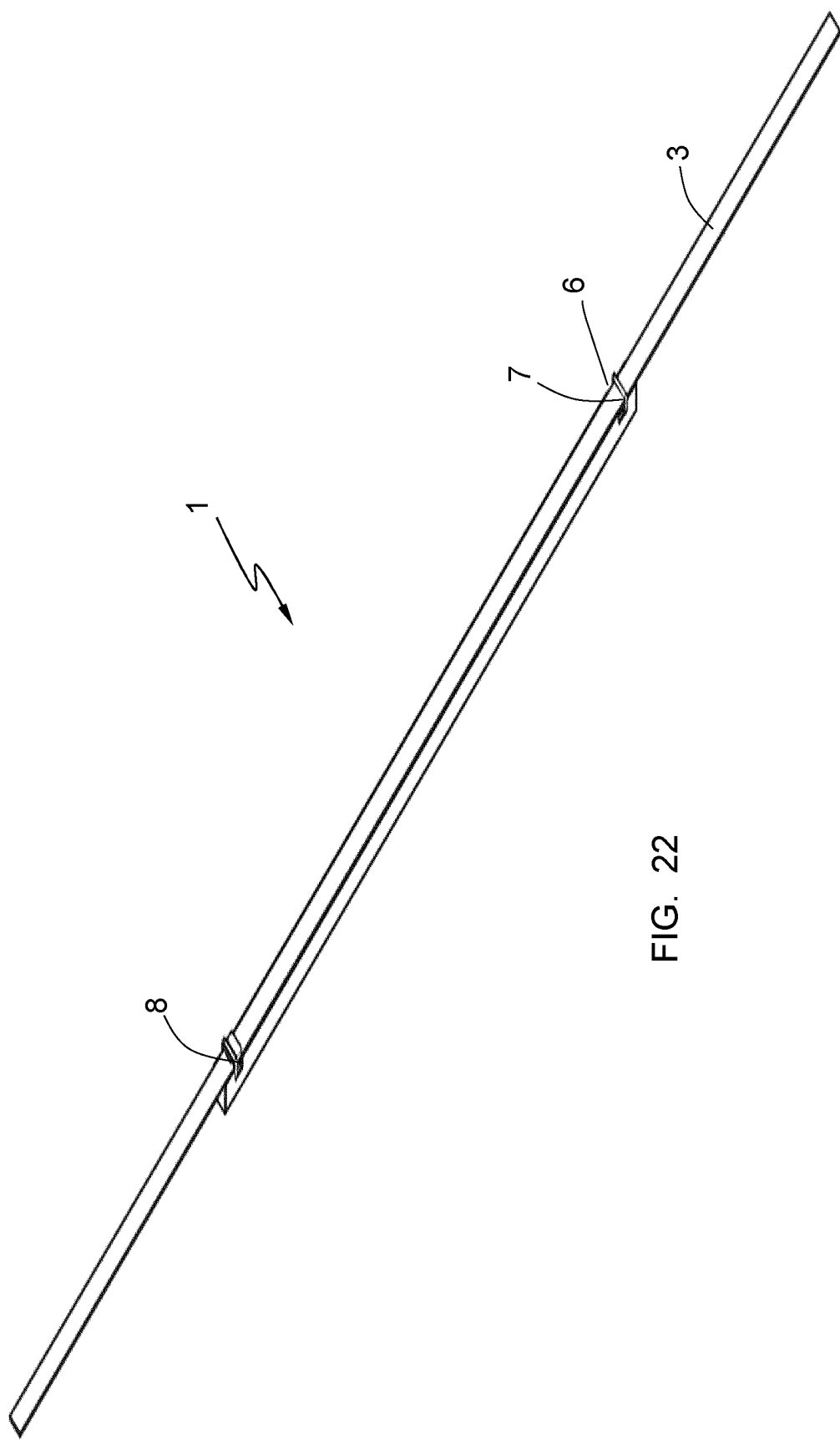
FIG. 22, a perspective view of a third embodiment of a system according to the invention.
Figure 23:
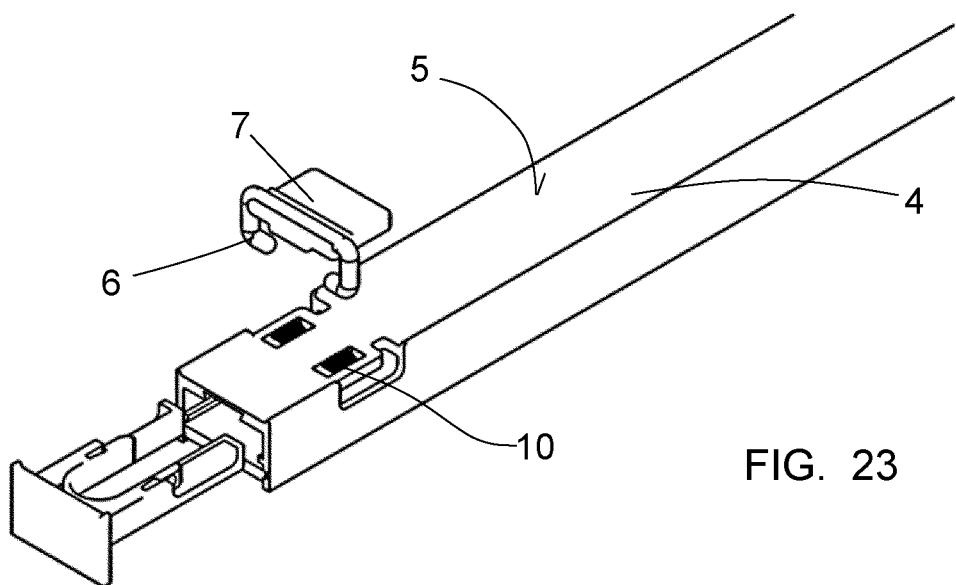
FIG. 23, a partial perspective view, of the region of the system of FIG. 22 corresponding to the connection means.
Figure 24:
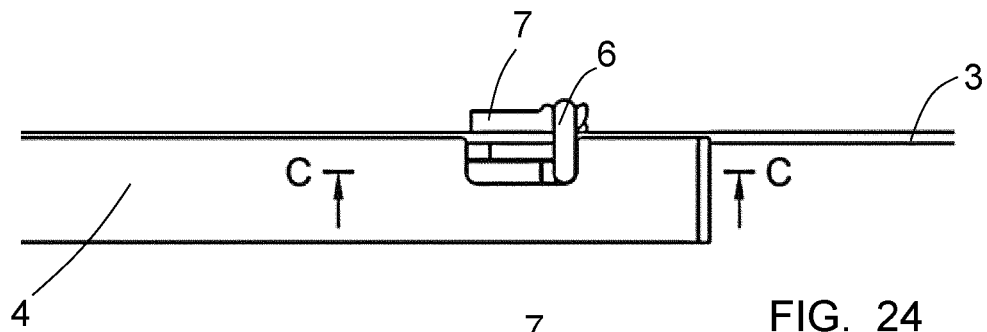
FIG. 24, a partial side elevation view, of the region of the system of FIG. 22 corresponding to the connection means.
Figure 25:
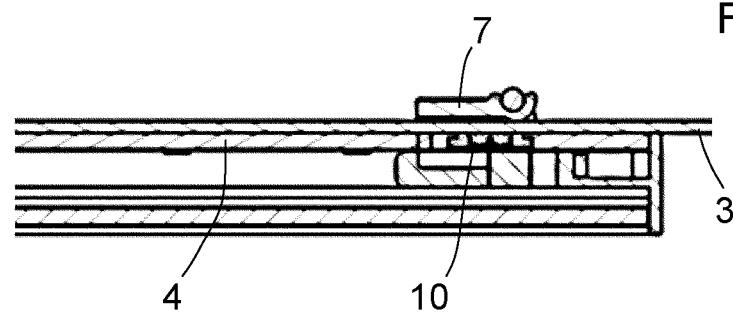
FIG. 25, a longitudinal sectional view of the region of FIG. 24.
Figure 26:
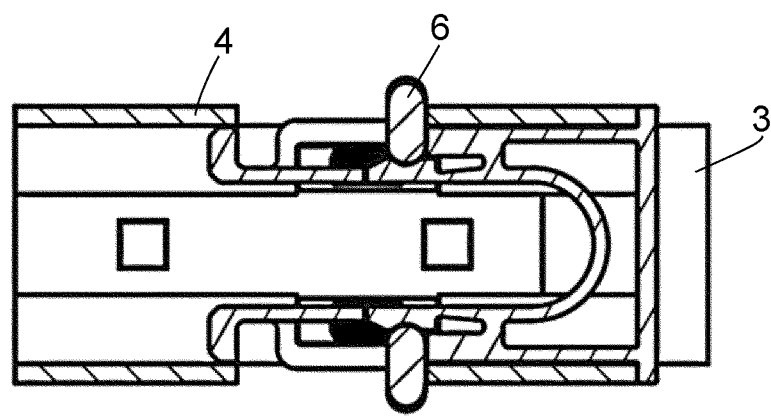
FIG. 26, a sectional view according to line CC of FIG. 24.

FIGS. 11 to 21 show a second embodiment of a system according to the invention. It shares a plurality of elements (except for, in some instances, geometrical differences which are not relevant for the invention) to which the same reference has been assigned and therefore, are not described again. In this embodiment, it is shown in more detail the sets of needles 10 which, in this case, are each formed by two mutually parallel rows, with two needles in each row. The needles of each set are fixed to a printed circuit board 11, which, in turn, is electrically connected to the rest of electric device 1 (not shown in the FIGS.). FIG. 16 shows support 4 seen from below (that is, by the opposite face to supporting surface 5) and there can be seen two spaces 12 provided for housing the printed circuit boards 11 and holes 13 for the passage of the needles.

FIGS. 22 to 26 show another embodiment of a system according to the invention. In this case, electric device 1 is an enlarged straight lighting unit, so that supporting surface 5 is flat (in the previous cases, it was convex). Nevertheless, the operation of the invention is the same. The same references have been used again for equal or equivalent elements to those of the previous embodiments. In this example, support 4 is the whole back portion of the lighting unit (in fact, it is the main body of lighting unit 1) and it is a remarkably elongated rectangle parallelepiped. Supporting surface 5 extends throughout the complete surface of support 4, but lever 7 is again very close to the sets of needles 10, thereby ensuring the effectiveness of the force exerted by cam 9.

Figure 27:
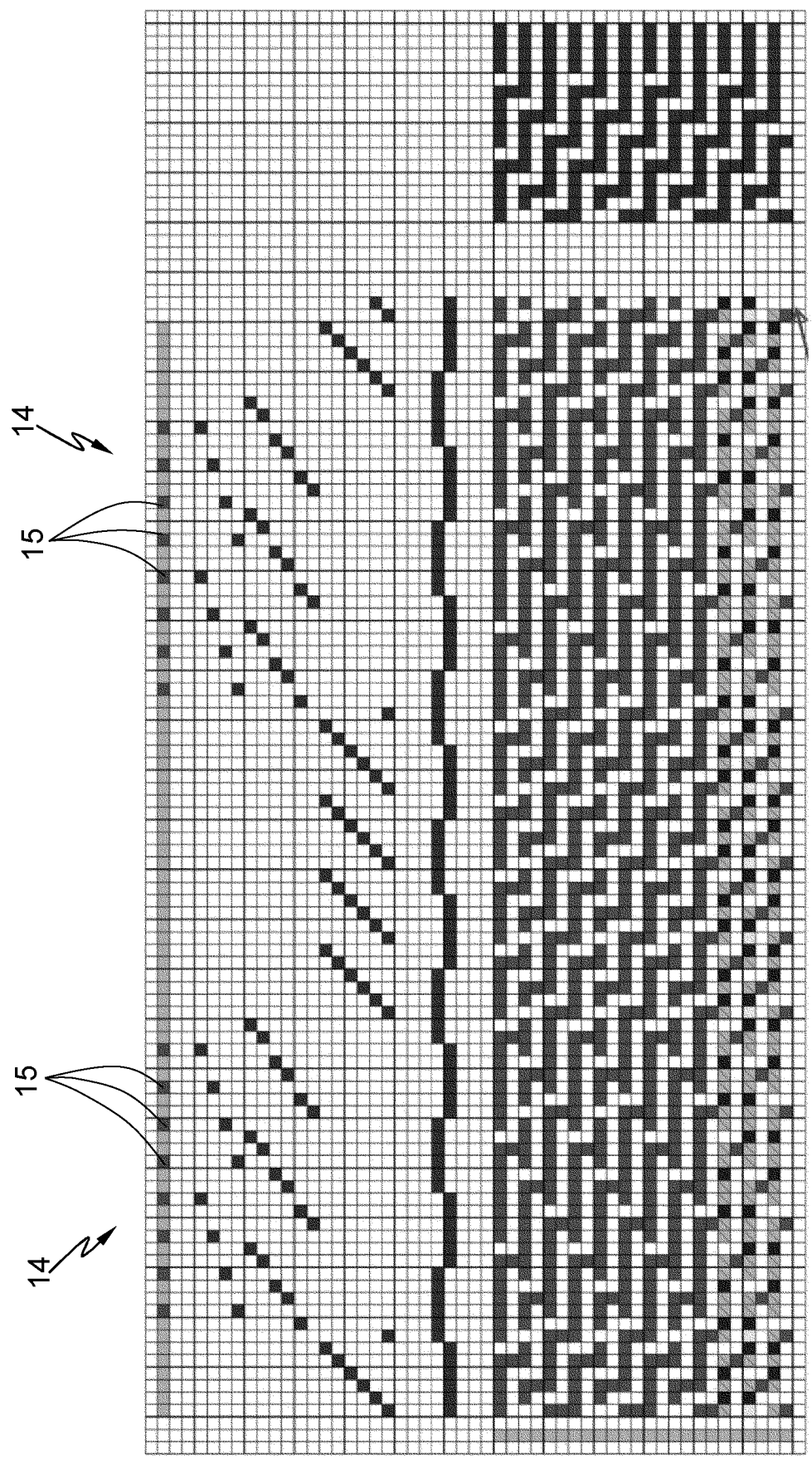
FIG. 27, a weaving draft of a first embodiment of a textile electrically conductive band according to the invention.
Figure 28:
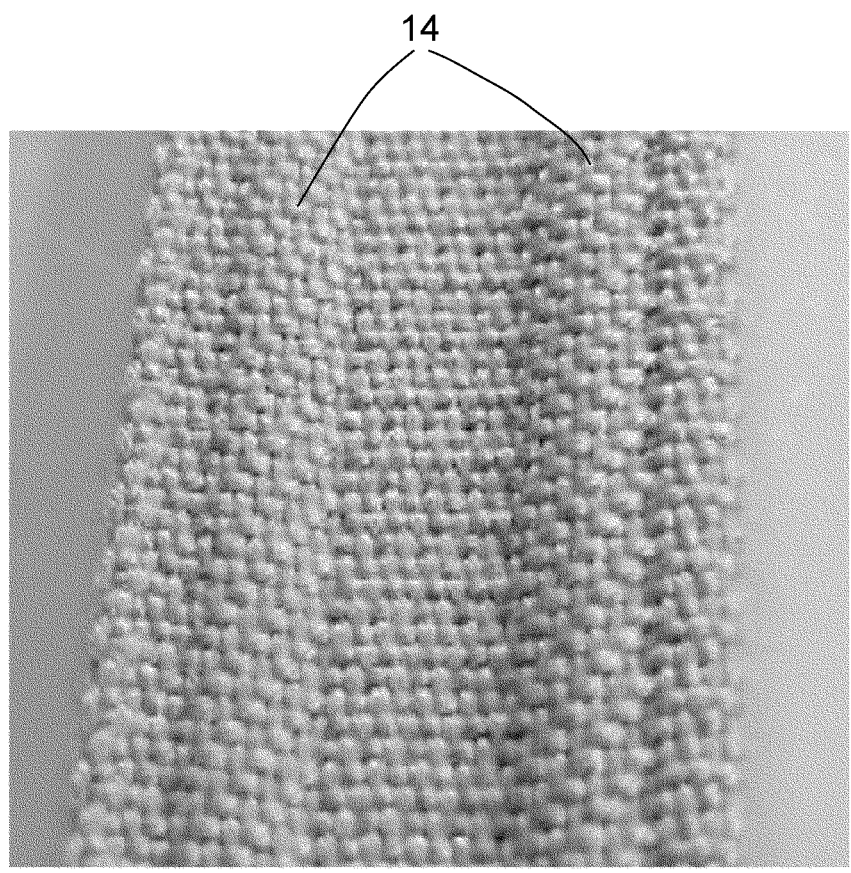
FIG. 28, a picture of a textile electrically conductive band made according to the weaving draft of FIG. 27.
Figure 29:
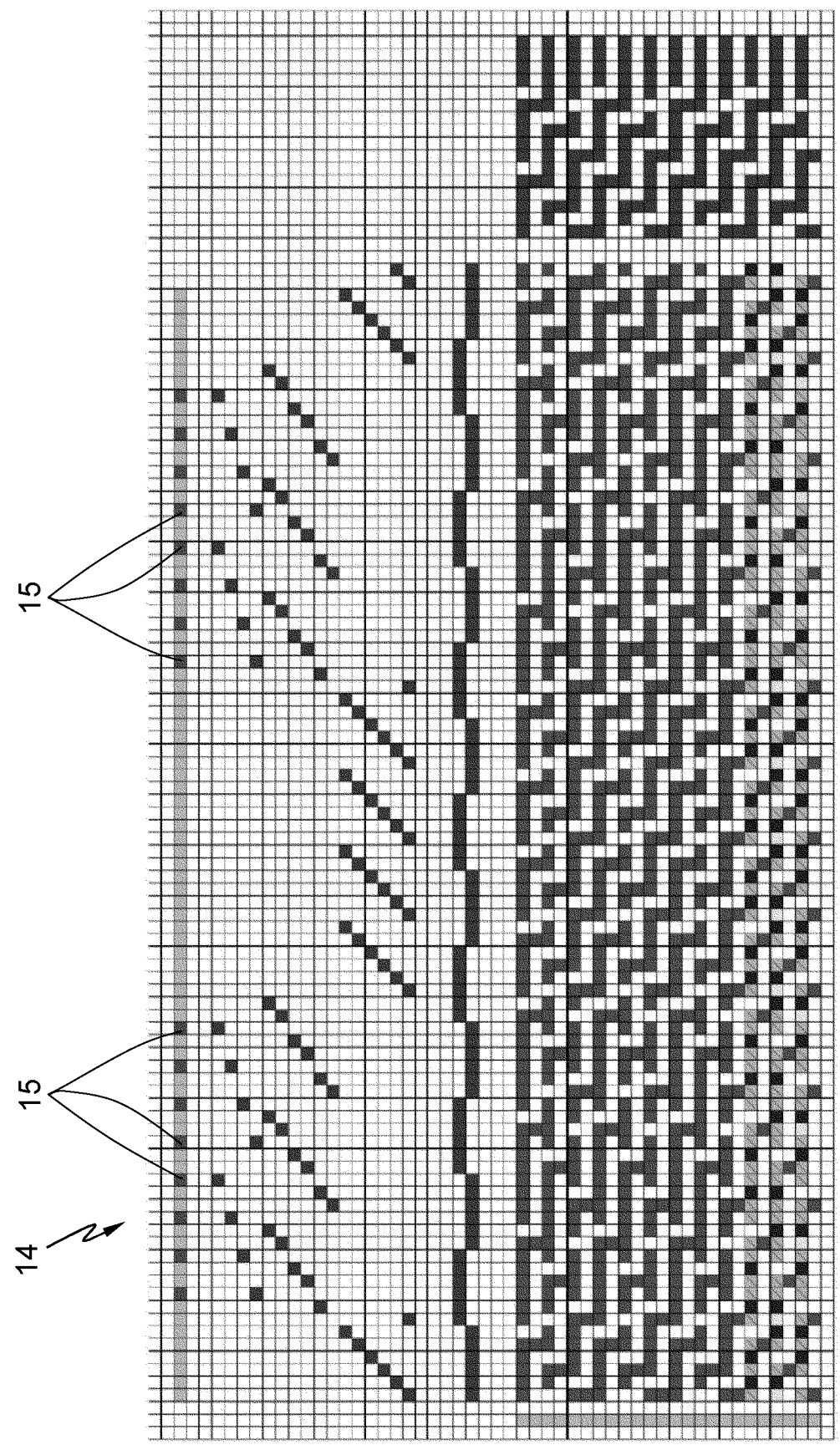
FIG. 29, a weaving draft of a second embodiment of a textile electrically conductive band according to the invention.
Figure 30:
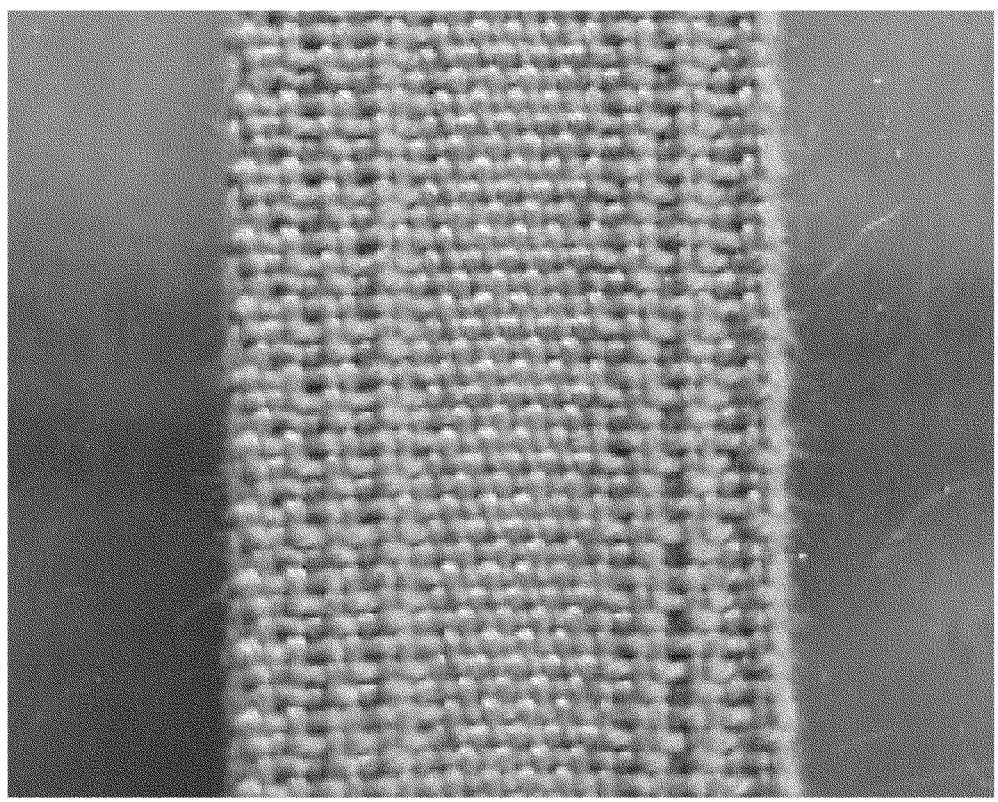
FIG. 30, a picture of a textile electrically conductive band made according to the weaving draft of FIG. 29.
Figure 31:
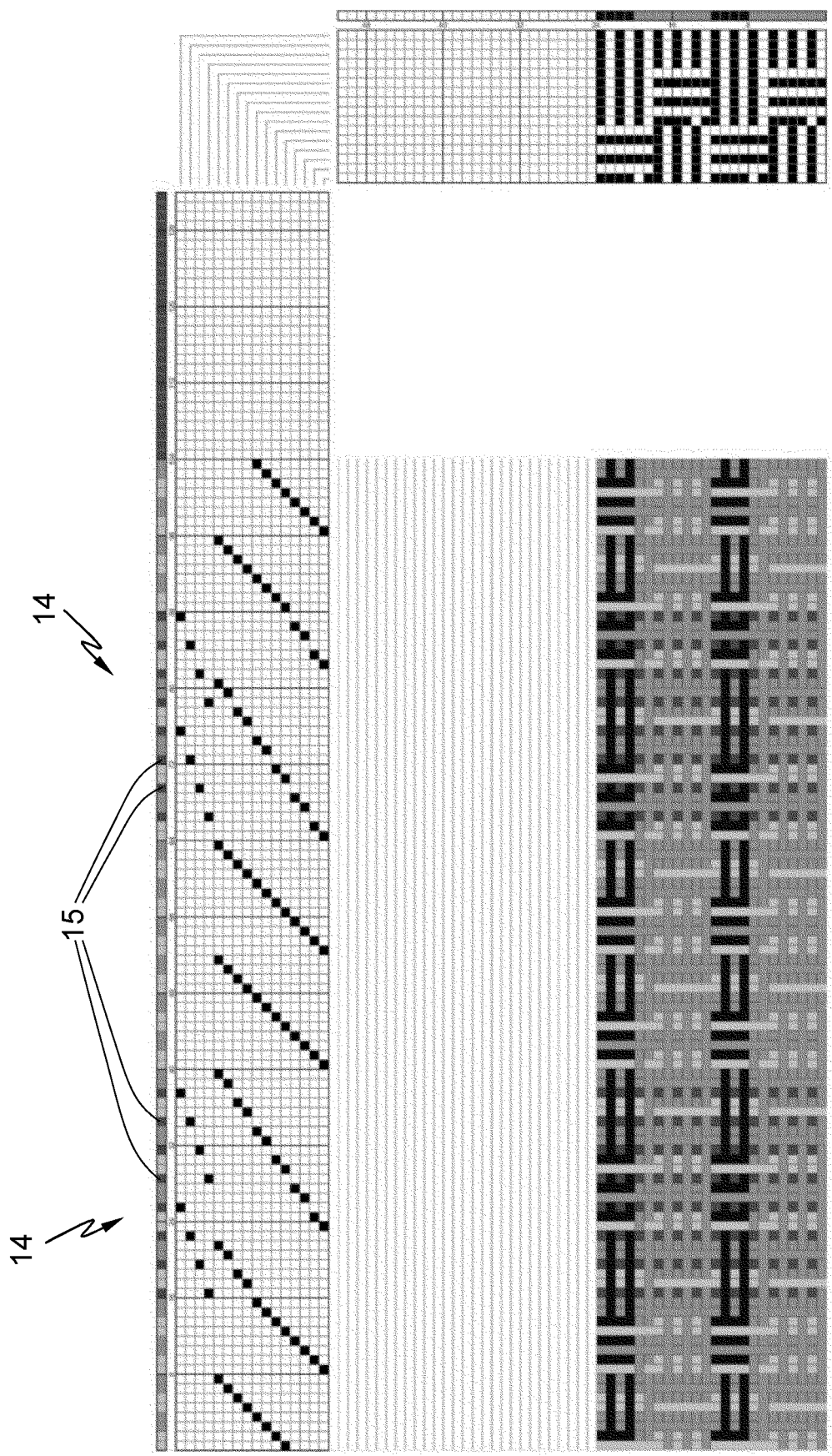
Figure 32:
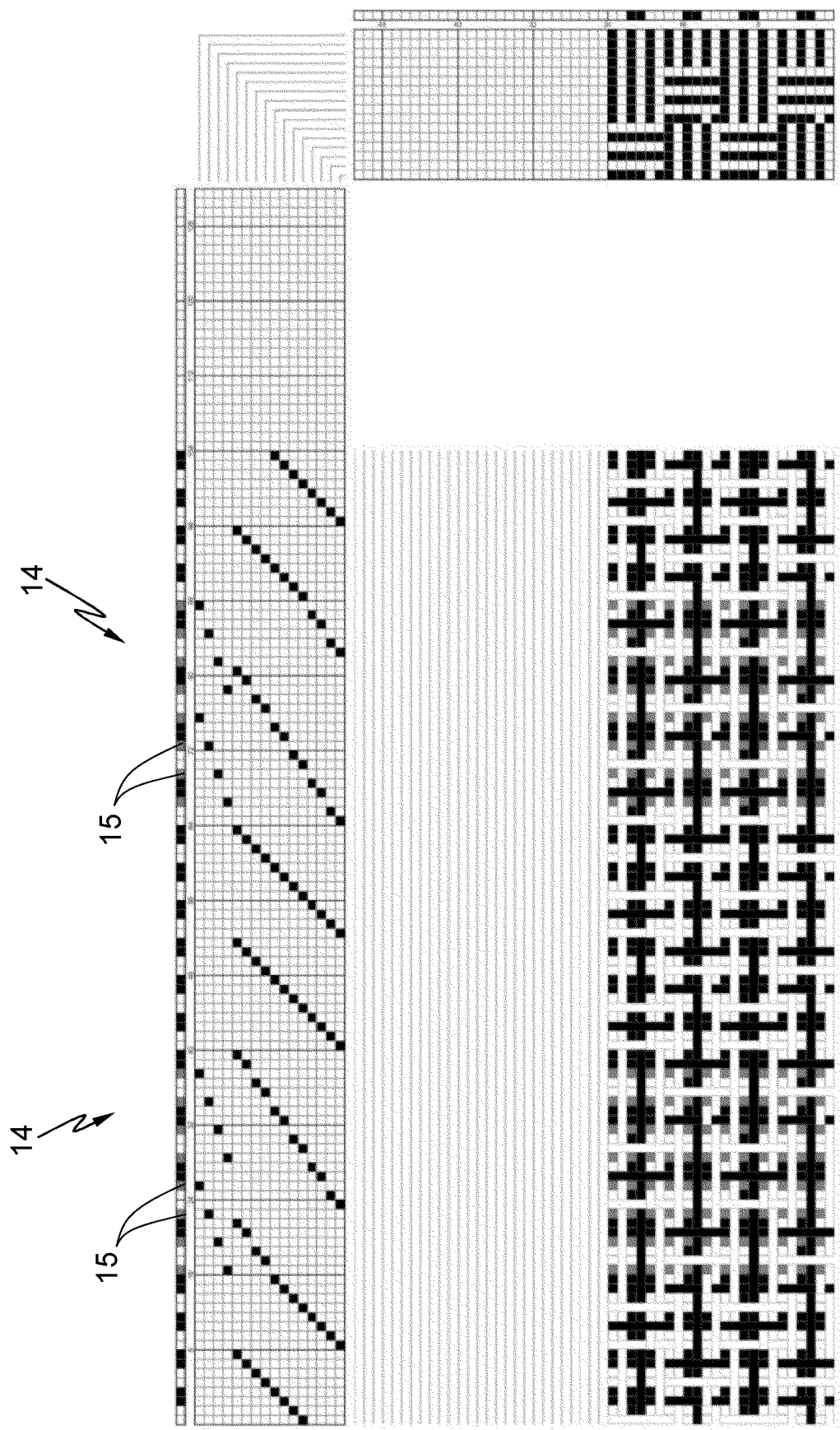
Figure 33:
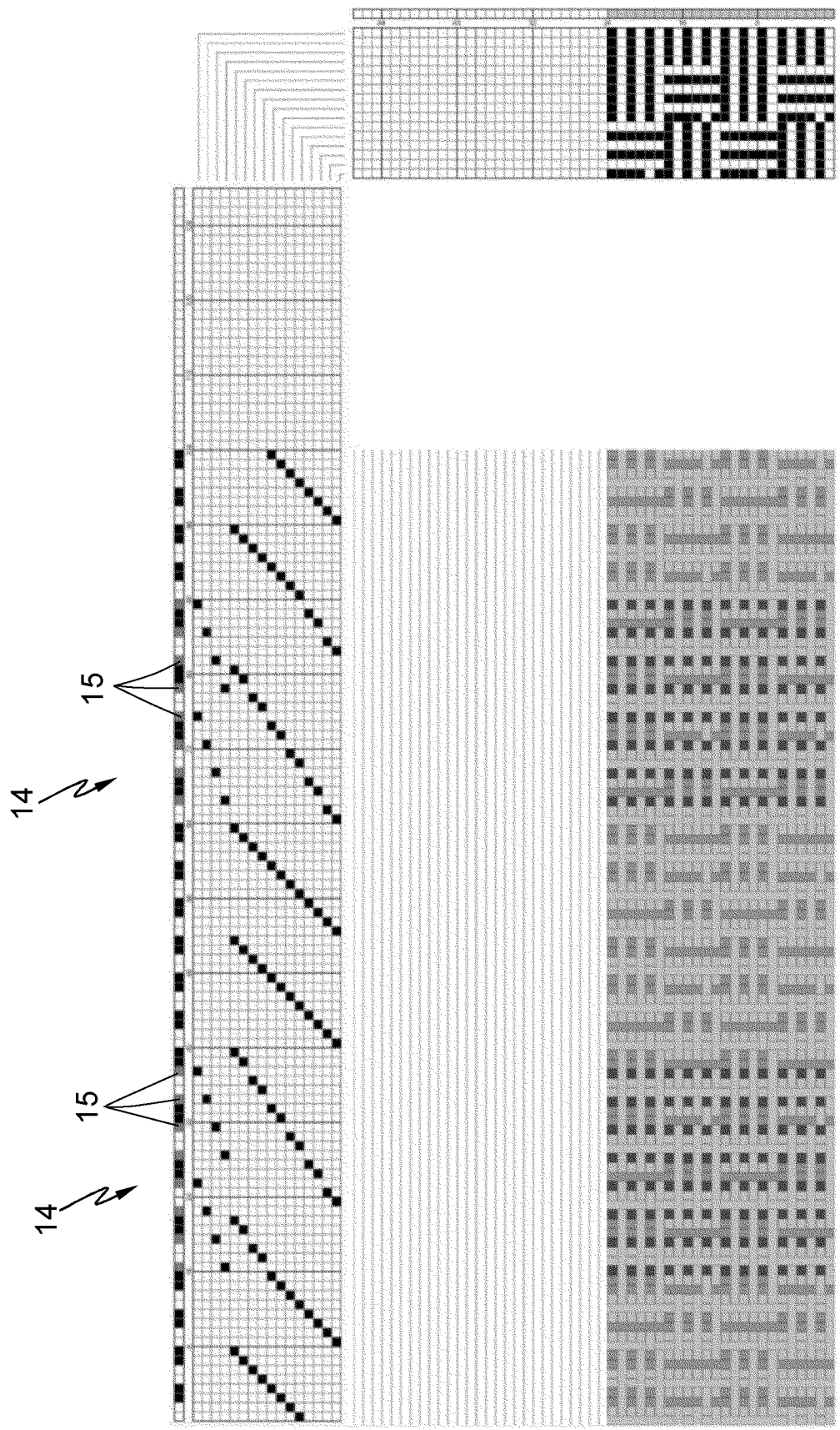
Figure 34:
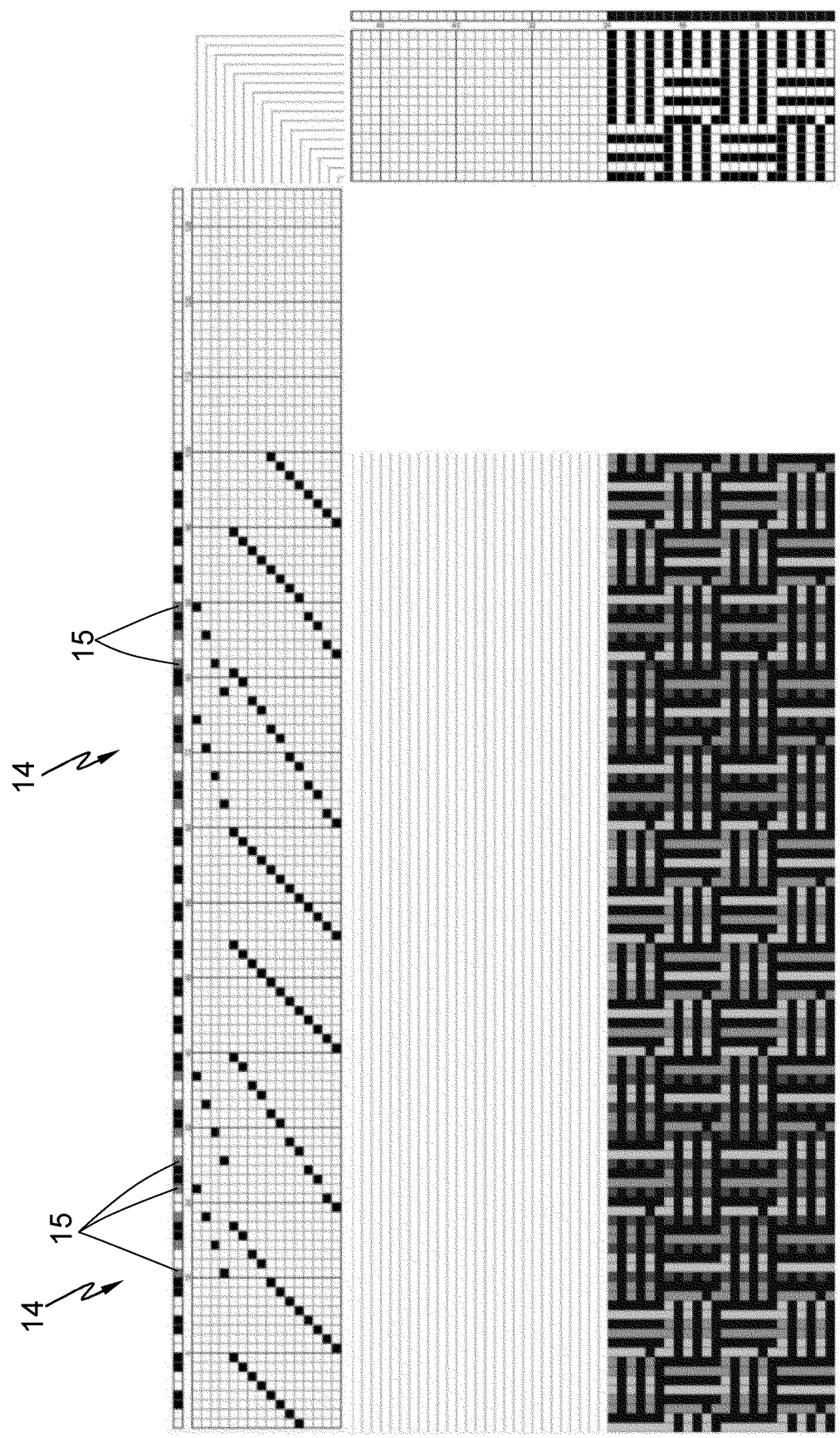
Figure 35:
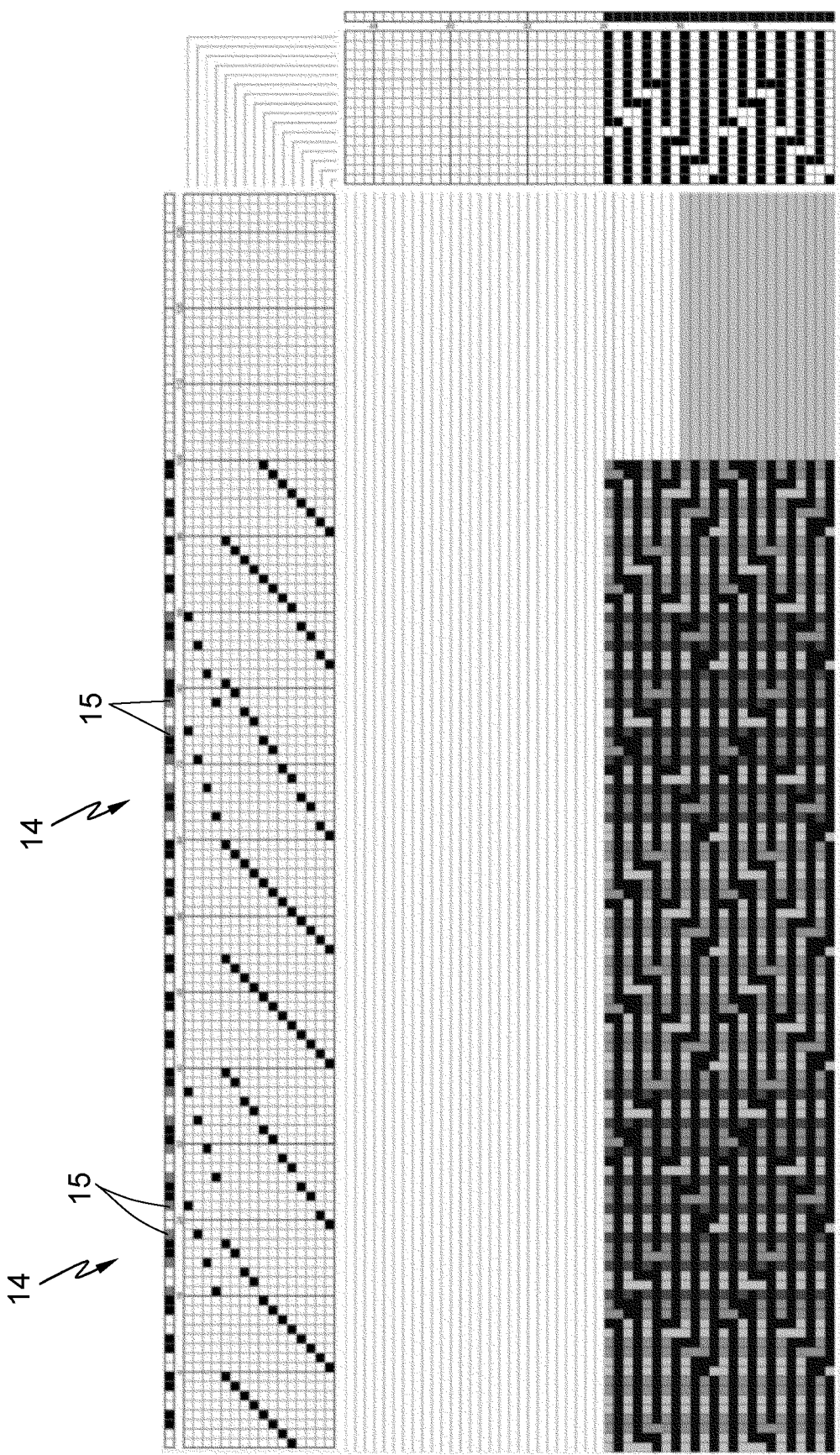
Figure 36:
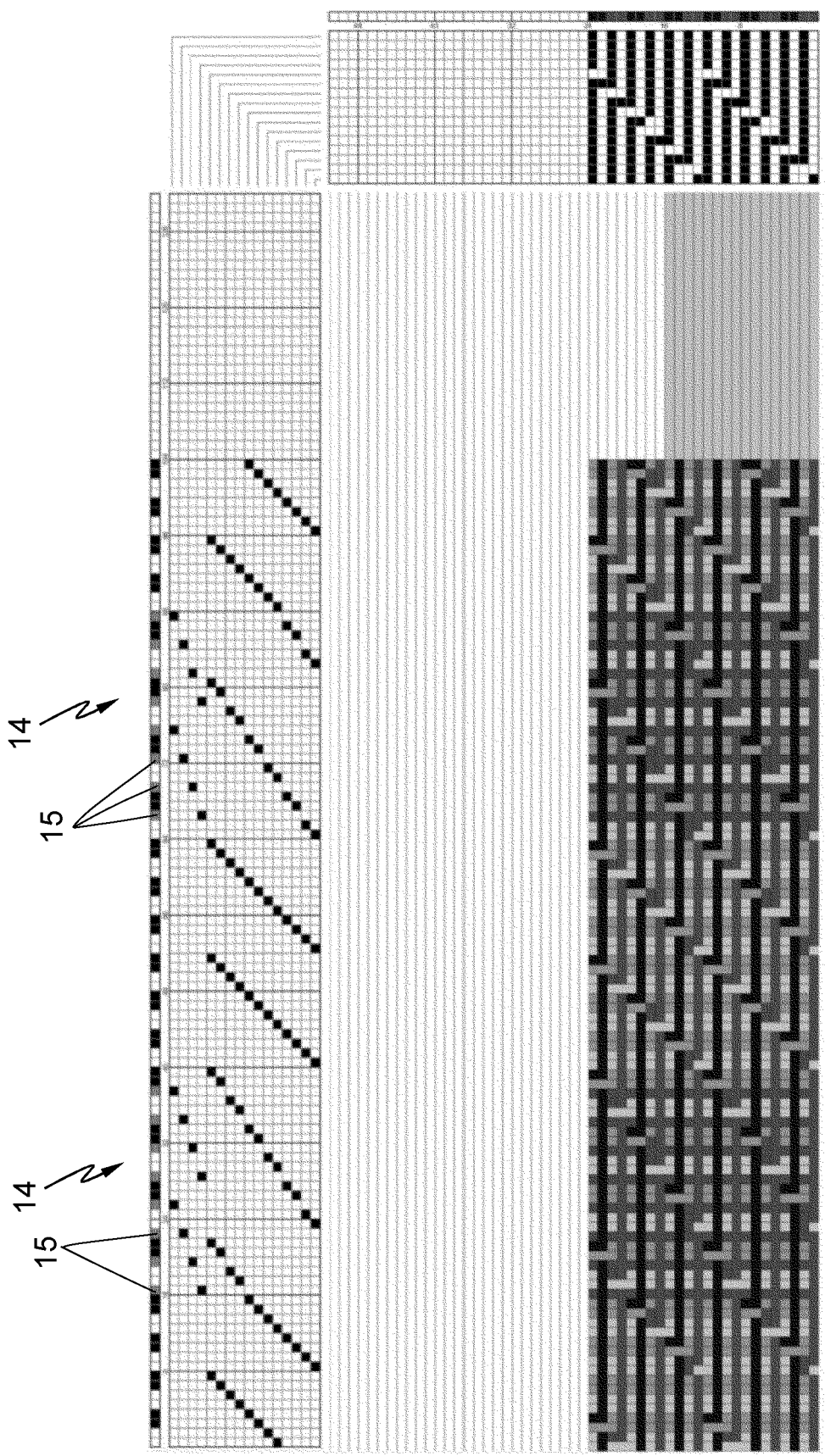

FIG. 27 shows the weaving draft of textile electrically conductive band 3 of FIG. 28. It comprises two electrically conductive guides 14, each with 8 metal threads 15 (indicated in dark grey), in particular of bare copper, that is, without any insulating covering. In a certain point (not shown in the FIGS.), metal threads 15 of each one of the electrically conductive guides 14 are connected to an electric power source, so that they can transmit electric power to the electric connection means 2 of electric device 1. The details of this example are the following:

- 88 warp threads used in total
- 19.5 weft threads per cm
- weaving reed 50/10 cm, draft 6 threads
- 100 picks per minute
- on the right side: warp threads 89 and 90 are not integrated/drawn in
- shaft 11 without point of interlacing (therefore, the copper threads are not parallel and are more compact in between the two textile layers)
- shaft 5 without point of interlacing FIGS. 29 and 30 are another weaving draft with the corresponding textile electrically conductive band 3. The details of this example are the following:

- 89 warp threads integrated/drawn in in total
- 20 weft threads per cm
- weaving reed 50/10 cm, draft 6 threads
- 100 picks per minute FIGS. 31 to 36 show 6 additional weaving drafts.

The invention claimed is:

1. Electric device with electric connection means suitable for connecting said electric device to an electric power source, wherein said electric device comprises a supporting surface for a textile electrically conductive band and retention means for retaining said textile electrically conductive band on said supporting surface, said electric connection means comprising piercing means for piercing said textile electrically conductive band, wherein said piercing means are suitable for conducting an electric current; wherein said retention means comprise an arch arranged on said supporting surface, wherein said retention means comprise a lever suitable for rotating around said arch between a release position and a retention position, said lever comprising a cam suitable for pressing said textile electrically conductive band on said supporting surface when said lever is in said retention position.

2. Electric device according to claim 1, wherein said piercing means comprise two sets of needles emerging from said supporting surface.

3. Electric device according to claim 2, wherein each set of needles comprises between 4 and 12 needles.

4. Electric device according to claim 2, wherein said needles project between 1.5 and 3.5 mm with respect to said supporting surface.

5. Electric device according to claim 1, wherein said piercing means are adjacent to said lever.

6. Electric device according to claim 1, wherein when said lever is in said retention position, said lever rests on said textile electrically conductive band covering said piercing means.

7. Electric device according to claim 1, wherein said arch is formed by a C-shaped part with the ends of said C connected to said electric device below said supporting surface.

8. Electric device according to claim 1, wherein said retention means comprise a second arch arranged on said supporting surface, where said arch and said second arch define a passage for said textile electrically conductive band.

9. Electric device according to claim 1, wherein said electric device is a lighting unit with at least a light source which is electrically connected to said electric connection means, or in that said electric device is an electric sensor.

10. Electric system comprising an electric device according to claim 1 and said textile electrically conductive band.

11. Electric system according to claim 10, wherein said textile electrically conductive band is made of double weaving and comprises two mutually parallel electrically conductive guides extending along said textile electrically conductive band, where each of said electrically conductive guides is located between two layers of textile material of said double weaving.

12. Electric system according to claim 11, wherein each of said electrically conductive guides is formed by a plurality of metal threads, where said metal threads do not have any insulating covering and each of said electrically conductive guides has a width comprised between 0.3 and 1.5 cm.

13. Electric system according to claim 11, wherein between the two electrically conductive guides, there is a separation comprised between 0.3 and 1.8 cm.

14. Electric system according to claim 11, wherein said textile electrically conductive band is formed with threads of polymer material and said threads of polymer material have 50 to 500 tex.

15. Electric system according to claim 11, wherein said textile electrically conductive band has a weft with 10 to 50 threads/cm and/or a warp with 10 to 60 threads/cm.

16. Electric system according to claim 11, wherein the two layers of said double weaving are interlaced to one another by 4 to 21 warp threads per cm.

\* \* \* \* \*